United States Patent
Ma

(10) Patent No.: US 7,641,505 B2
(45) Date of Patent: Jan. 5, 2010

(54) ELECTRICAL CONNECTOR ASSEMBLY WITH HEAT DISSIPATING DEVICE

(75) Inventor: Hao-Yun Ma, Tu-cheng (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 12/288,772

(22) Filed: Oct. 23, 2008

(65) Prior Publication Data

US 2009/0101318 A1 Apr. 23, 2009

(30) Foreign Application Priority Data

Oct. 23, 2007 (CN) .................... 2007 2 0044582 U

(51) Int. Cl.
*H01R 13/00* (2006.01)
(52) U.S. Cl. ................ 439/485; 439/487; 361/711
(58) Field of Classification Search ................ 439/485, 439/486, 487; 361/711, 702
See application file for complete search history.

(56) References Cited

U.S. PATENT DOCUMENTS

| 5,722,848 | A | 3/1998 | Lai et al. | |
| 7,001,197 | B2 | 2/2006 | Shirai et al. | |
| 7,388,747 | B2* | 6/2008 | Yang et al. | 361/700 |
| 2008/0291638 | A1* | 11/2008 | Ma et al. | 361/719 |
| 2009/0142956 | A1* | 6/2009 | Ma | 439/485 |

* cited by examiner

*Primary Examiner*—Hae Moon Hyeon
(74) *Attorney, Agent, or Firm*—Andrew C. Cheng; Wei Te Chung; Ming Chieh Chang

(57) ABSTRACT

An electrical connector with a heat dissipating device adapted to physically in contact with an electrical package disposed on a socket connector comprises a load plate having a substantially rectangular configuration defining a central opening having a first length and a first width and a heat plate having longitudinal sides and traversal ends. A heat plate has a heat pipe attached thereon and arranged such that the heat plate is disposed under the load plate, while the heat pipe is arranged above the load plate when rotated.

19 Claims, 8 Drawing Sheets

ELECTRICAL CONNECTOR ASSEMBLY WITH HEAT DISSIPATING DEVICE

BACKGROUND OF THE INVENTION

1. Field of the Invention

The present invention relates to an electrical connector assembly, and more particularly to an electrical connector assembly with a heat dissipating device to efficiently dissipating heat generated from a CPU (Central Process Unit) mounted within the socket assembly.

2. Description of the Prior Art

U.S. Pat. No. 5,722,848 issued to Lai on Mar. 3, 1998 discloses a typical connector socket, and which is generally referred to as a ZIF (Zero Insertion Force) socket. In general, the socket includes a base with a plurality of contacts assembled therein, and a cover moveably attached to the base. A lever with a cam mechanism is arranged between the base and cover to drive the cover from a first position to a second position. When the lever is located in a vertical position, the cover is located at the first position, in which a hole in the cover is completely in aligned with a corresponding passageway in the base. In this position, pins of the CPU can be inserted from the cover into the passageway without any engagement with the contact. When the CPU is properly seated on the cover, then the lever is moved from the vertical position to a horizontal position, and simultaneously driving the cover from the first position to the second position. During this process, the pins of the CPU are then in contact with the contact within the base. The Lai '848 is specially directed to a desk-top computer.

CPU socket used on notebook is substantially similar to what is used on the desktop computer, and the only difference is on the lever used on '848 patent was replaced by a screw with a cam mechanism. When the screw is driven or rotated, the cover is driven to move along the base, therefore the pins of the CPU are then in contact with the contact within the base, and no detailed description is given here.

U.S. Pat. No. 7,001,197 issued to Shirai on Feb. 21, 2006 discloses another type of socket, and which can be generally called LGA (Land Grid Array) socket. The original pins type of chip occupies more space on the bottom surface of the CPU. In order to increase input/output speed, conductive pads are introduced to replace the pins so as to directly and electrically contact with contact terminals within the socket. No doubt, the speed is increased.

As clearly shown in Figures of Shirai '197, it is different configuration from to what Lai '848 discloses. The socket generally includes a metal stiffener with a housing securely supported therein. Then a metal clip is pivotally assembled to the stiffener. On the other hand, the clip is pivotally assembled to one side of the stiffener and when the clip is closed to the stiffener, the lever has a cam which can lock the clip to a closed position. By this arrangement, the CPU is seated on the housing before the clip is closed, and then the clip will tightly press the CPU toward the housing for ensuring proper electrical connection therebetween.

Shirai '197 can be applied to the desktop computer for which has more room for the operation of the lever, while it is almost impossible to apply Shirai '197 directly to the notebook in view of its compact, and thin space.

Another factor to be considered is the configuration of the CPU. The CPU generally includes a substrate and a die mounted upon the substrate. Even the CPU is rigid, it is still vulnerable to deform or warp for downward force applied thereon is not evenly distributed. In Shirai '197 patent, the die is not pressed by the clip which has a window for it. The die is in direct contact with a heat sink. As a result, when applying the so-called LGA socket to notebook, how to provide a mechanism functionally similar to Shirai '197, while keep downward force evenly distributes to both die and substrate, is a motive for the present invention.

The configuration of heat sink is another factor to be considered. Typically, the heat sink device includes a bottom plate and a plurality of parallel heat sink clip disposed on the bottom plate. As the heat sink device generally has a big volume, it applied to the desktop computer is ok, while it is almost impossible to apply to the notebook in view of its compact and thin space.

Therefore, there is need to supply an improved electrical connector assembly with a heat dissipating device.

SUMMARY OF THE INVENTION

Accordingly, an object of the present invention is to provide an electrical connector assembly with a heat dissipate device which can dissipate heat for the CPU and exert a downward force to the CPU to prevent the CPU warp.

In order to achieve the object set forth, a heat dissipating device adapted to physically in contact with an electrical package disposed on a socket connector comprises a load plate having a substantially rectangular configuration defining a central opening having a first length and a first width and a heat plate having longitudinal sides and traversal ends. A heat plate has a heat pipe attached thereon and arranged such that the heat plate is disposed under the load plate, while the heat pipe is arranged above the load plate when rotated.

In order to further achieve the object set forth, an electrical connector assembly comprises a socket, a load plate disposed upon the socket assembly, a heat plate and a heat pipe. The load plate has a substantially rectangular configuration defining a central opening having a first length and a first width. A heat plate with a heat pipe attached thereon forms an entity heat sink, and assembles the heat sink to the load plate such that the load plate is clamped by the heat pipe and heat plate.

DESCRIPTION OF PREFERRED EMBODIMENT

Reference will now be made to the drawings to describe the present invention in detail.

Figure 1:
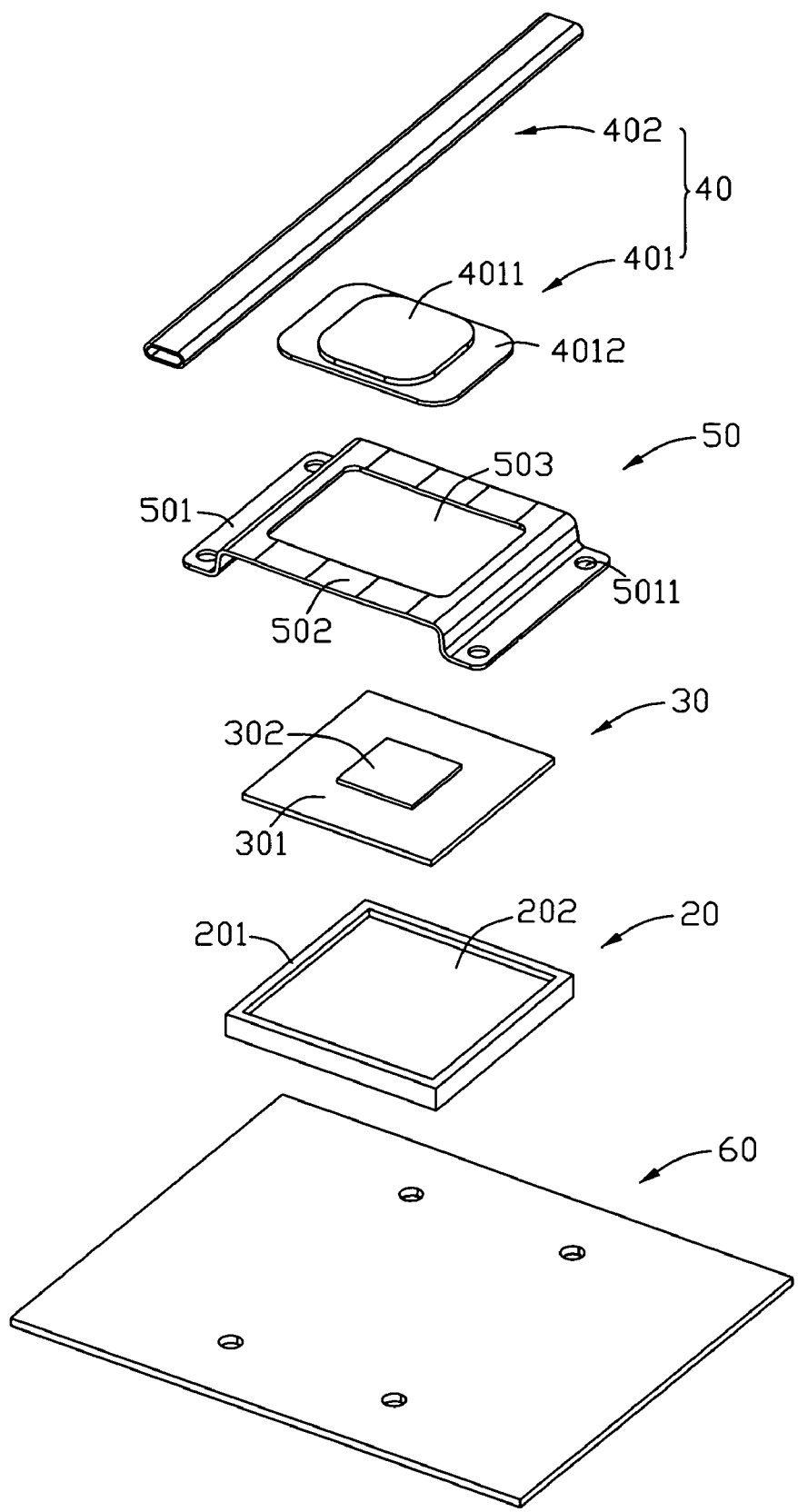
FIG. 1 is an exploded view of an electrical connector assembly in accordance with the present invention.
Figure 2:
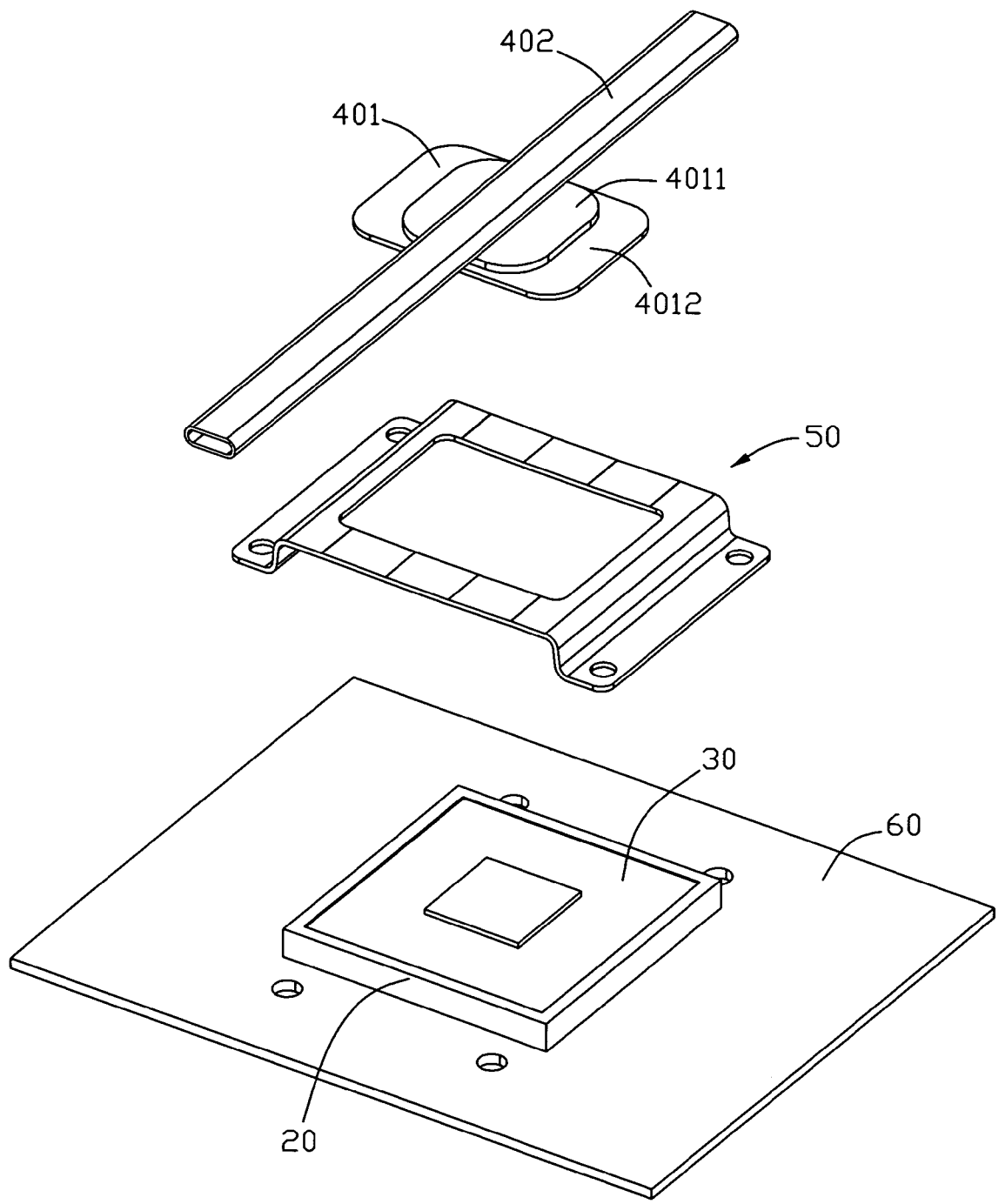
FIG. 2 is an exploded view of the electrical connector assembly shown in FIG. 1, showing a heat pipe mounted on a heat plate.
Figure 3:
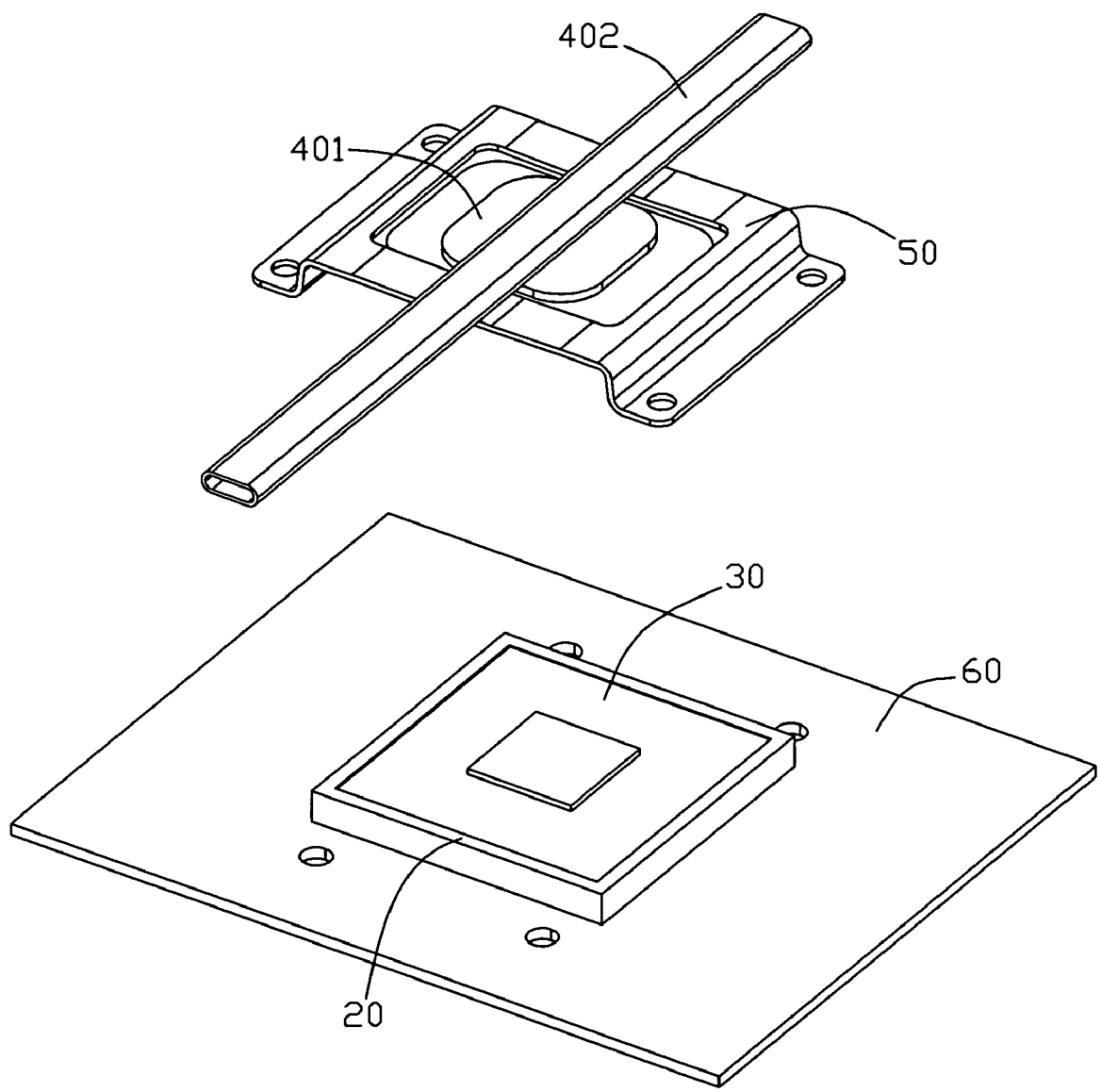
FIG. 3 is an exploded view of the electrical connector assembly shown in FIG. 2, showing the next assembly composed of the heat pipe and heat plate assembled to a load plate.
Figure 4:
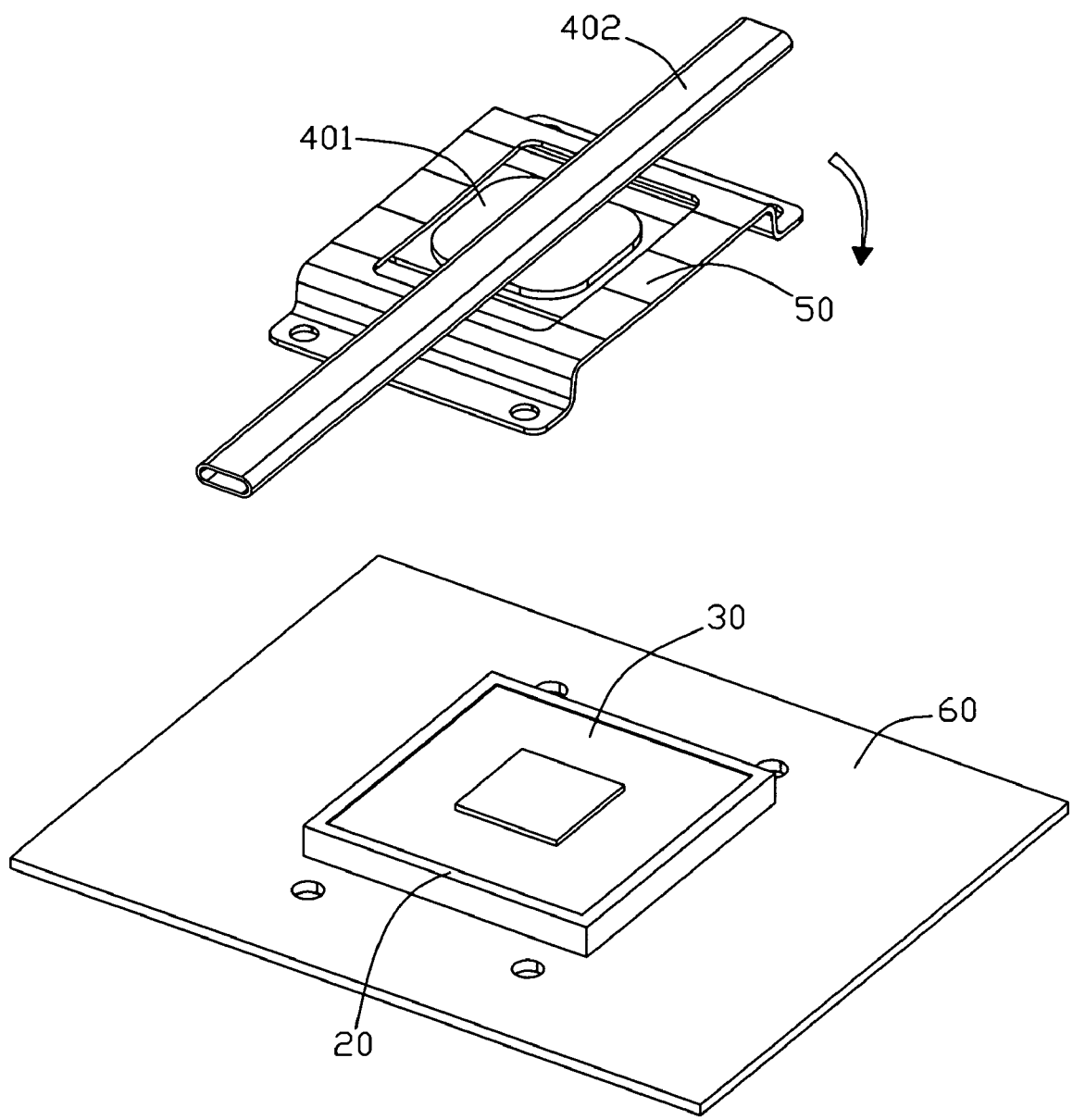
FIG. 4 is an exploded view of the electrical connector assembly shown in FIG. 3, showing the load plate rotated 90 degrees respective to the assembly composed of the heat pipe and heat plate.
Figure 5:
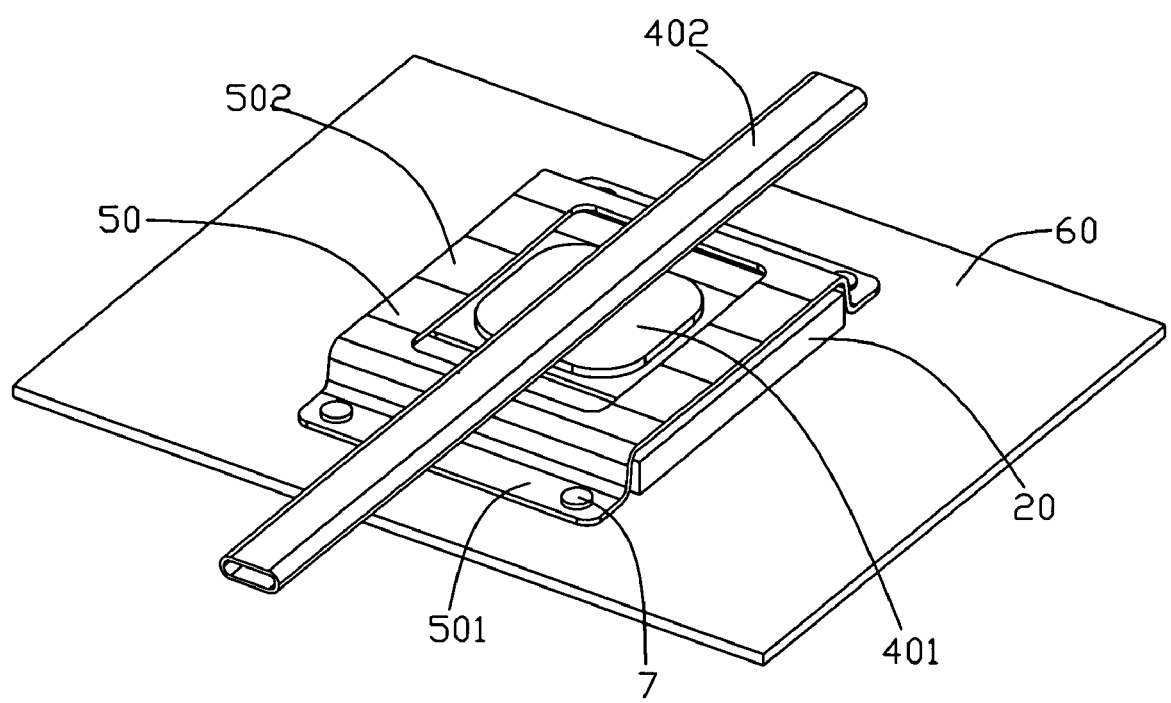
FIG. 5 is assembled perspective view of the electrical connector assembly shown in FIG. 1.

Referring to FIG. 1, an electrical connector assembly of the present invention is used to a printed circuit board 60 and comprises an electrical connector 20 mounted on the printed circuit board 60, an electrical package 30 received in the electrical connector 20 and a heat dissipating device disposed on the electrical package 30. The heat dissipating device comprises a heat sink 40 and a load plate 50.

The electrical connector 20 electrically connected with the electrical package 30 and the printed circuit board 60 comprises a substantially rectangular insulative housing 201 with a cavity 202 and a plurality of contacts (not shown) received in the cavity 202. The contacts engage with the electrical package 30 at a top end thereof and solder to the printed circuit board 60 at a bottom end thereof.

The electrical package 30 comprises a substrate 301 and a die 302 disposed in the middle of the substrate 301 and protruding from the substrate 301.

The heat sink 40 includes a metal heat plate 401 and a metal heat pipe 402. The heat plate 401 is substantially rectangular configuration corresponding to the electrical package 30 and defines a longitudinal side and a traversal side. The heat plate 401 comprises a first pressing portion 4011 depressed in a bottom surface thereof and protruding out off top surface thereof, and a second pressing portion 4012 symmetrically disposed in the traversal sides of the heat plate 401. The first pressing portion 4011 has a recess at a bottom end thereof used for receiving the die 302 of the electrical package 30. When assemble the heat plate 401 upon the electrical package 30, the first pressing portion 4011 of the heat plate 401 presses the die 302 of the electrical package 30 and the second pressing portion 4012 presses the substrate 301 of the electrical package 30 so as the electrical package 30 can keep in a good condition.

The load plate 50 is used for pressing the electrical package 30 toward the electrical socket 20, and made of metal material or other material, in the present embodiment, the load plate 50 is made of metal material. The load plate 50 is substantially rectangular configuration and comprises a pair of parallel retaining portions 501 in traversal sides and a pair of parallel loading portion 502 connected with the retaining portion 501 in longitudinal sides. The corners of the retaining portion 501 define a plurality of holes 5011 for a plurality of screws 7 or the like extending therethrough to fasten the load plate to the printed circuit board 60. The retaining portion 501 and loading portion 502 form an opening 503 therebetween to allow the heat plate 401 passing through.

FIG. 2 to FIG. 5 is shown assembly processes of the electrical connector assembly: first solder the electrical connector 20 to the printed circuit board 60; then put the electrical package 30 to the cavity 202 of the electrical connector 20; at last assemble the heat dissipate device upon the electrical package 30. The assembly processes of the heat dissipate device is different to generally processes, which essentially comprises steps as follows: (1) solder the heat pipe 402 to the heat plate 401 to form an entity heat sink 40; (2) put the entity heat sink 40 into the opening 503 of the load plate 50 to make the heat pipe 402 above the load plate 50 and the heat plate 401 in the opening 503 of the load plate 50; (3) rotate the load plate 50 to make the load plate 50 pressed the second pressing portion 4012 of the heat plate 401, in present embodiment, the load plate 50 is rotated substantially 90 degrees; (4) fasten the load plate 50 to the circuit board 60 by screws 7.

Figure 6:
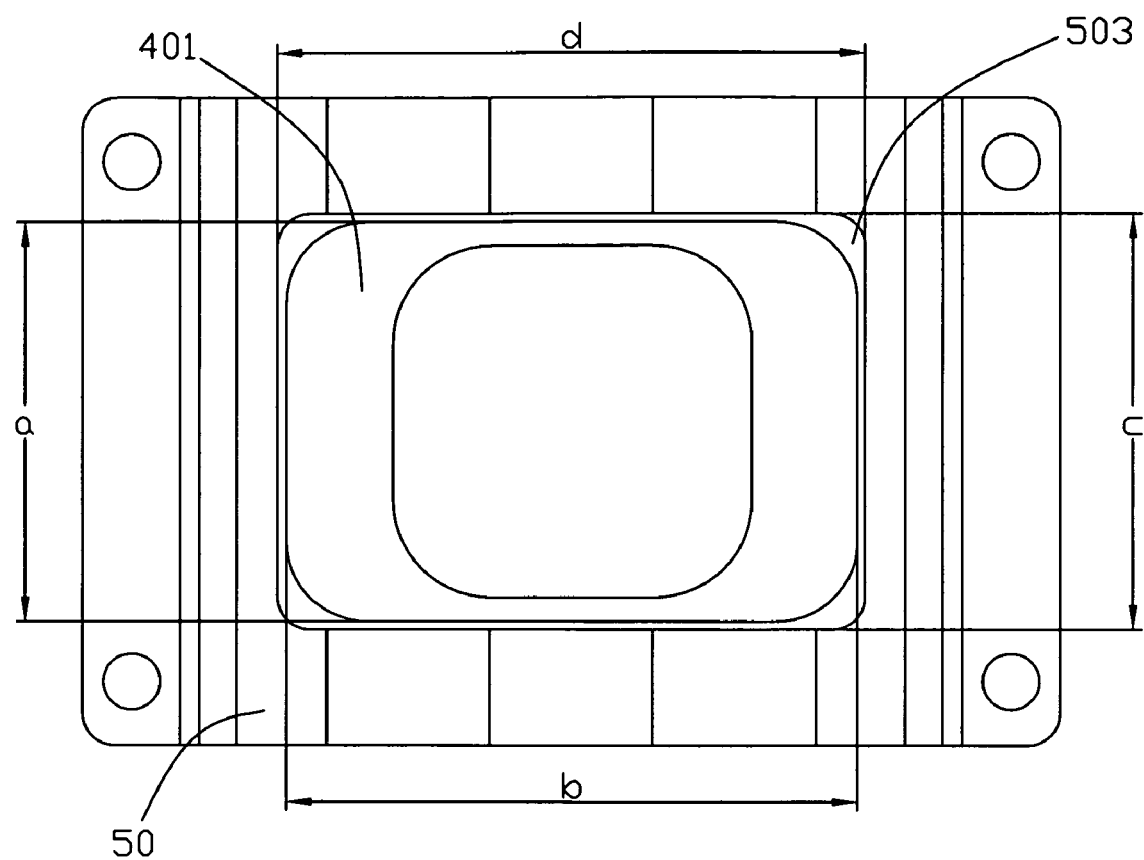
FIG. 6 is a top view of a heat plate and a load plate of the electrical connector assembly.
Figure 7:
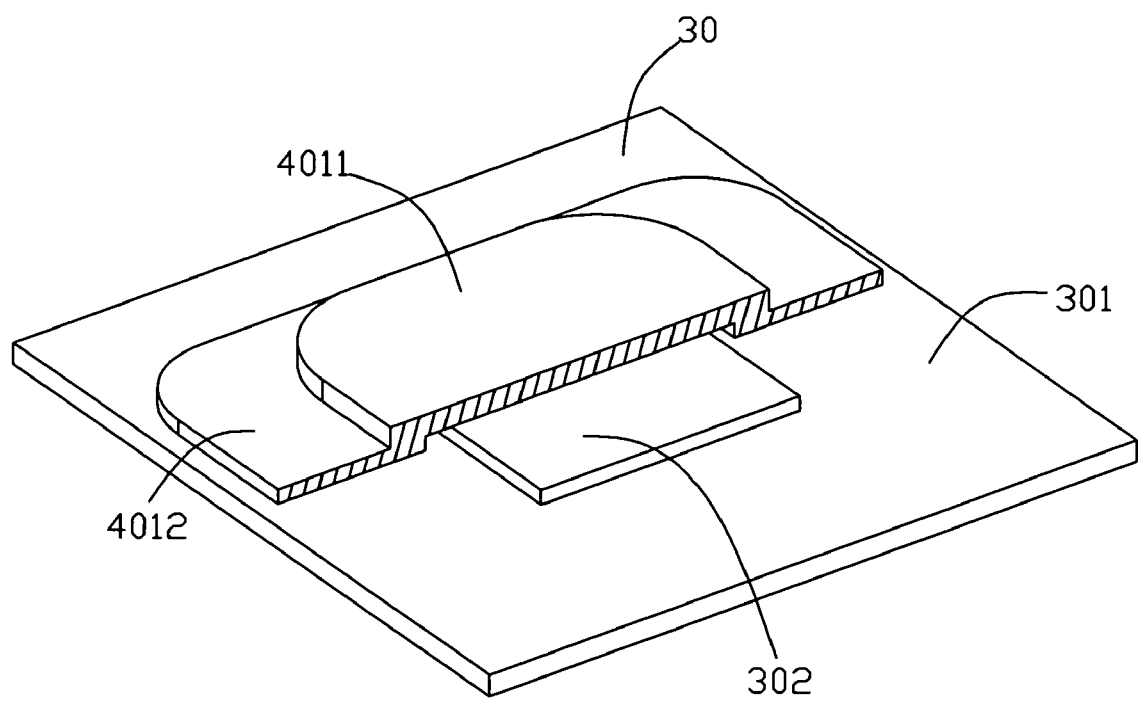
FIG. 7 is a partial view of the heat plate and an electrical package shown in FIG. 1.

To achieve the assembly of the heat dissipate device processes as above said, the opening 503 of the load plate 50 and the heat plate 401 must achieve some special structures. FIG. 6 describes some special structures of the opening 503 of the load plate 50 and the heat plate 401. We use "d" to represent the length of the opening 503, "c" to represent the width of the opening 503, and use "b" and "a" respectively to represent the length and width of the heat plate 401. The special structures are as follows: firstly, the heat plate 401 must be rectangular configuration, i.e. b>a. The ends of the long sides must provide the second pressing portion 4012 for supporting the load plate 50 and the first pressing portion 4011 which is higher than the second pressing portion 4012 (as FIG. 7 shown) for distributing a force to the die 302 and the substrate 301 of the electrical package 30; secondly, the longitudinal sides and the traversal sides of the opening 503 of the load plate 50 is bigger or equal than the respectively longitudinal sides and the traversal sides of the heat plate 401, i.e. d≧b, c≧a, thereby the heat plate 401 can be put into the opening 503 of load plate 50; thirdly, the length of the heat plate 401 must be bigger than the width of the opening 503, i.e. b>c, under this condition, after rotating the load plate 50 respective to the heat plate 401, the loading portion 502 of the load plate 50 could press on the second pressing portion 4012 of the heat plate 401. As has been said, we can use one expression to illustrate the special structure that is d≧b>c≧a.

Figure 8:
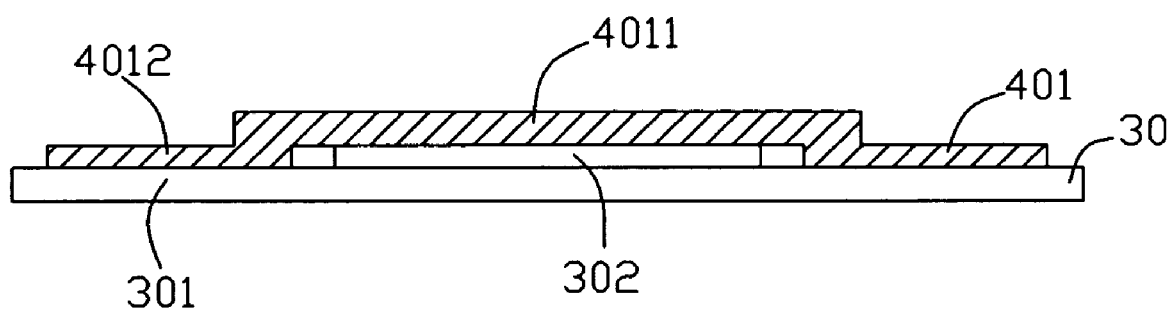
FIG. 8 is a side view of the heat plate and the electrical package shown in FIG. 7.

FIG. 8 is a side view of the heat plate 401 assembled to the electrical package 30. Understandably, the die 302 of the electrical package 30 supports the first pressing portion 4011 and the substrate 301 of the electrical package 30 supports the second pressing portion 4012, thus the die 302 and the substrate 301 could bear the force simultaneously for preventing the warp of the electrical package 30. The loading plate 50 mounted to the print circuit board 60 has two main functions: the first is to secure the electrical package 30 on the electrical connector 20 to establish well electrical connection; the second is to secure the heat plate 401 on the electrical package 30 for dissipating heat from the electrical package 30.

The principle of the present invention is first soldered the heat plate 401 and the heat pipe 402 together as an entity heat sink 40 and then assembled the heat sink 40 to the load plate 50 to make the load plate 50 positioned between the heat plate 401 and heat pipe 402 and clamped by the heat sink 40. Accordingly, when in the process of soldering the heat plate 401 and the heat pipe 402 together, the load plate 50 will not be warped. If we first assemble the heat plate 401, load plate 50 and then weld the heat pipe 402 on the heat plate 401, understandably, this will generate quantity of heat to make the load plate 50 warped.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A heat dissipating device adapted to physically in contact with an electrical package disposed on a socket connector, comprising:

a load plate having a substantially rectangular configuration defining a central opening having a first length and a first width; and a heat plate with a heat pipe attached thereon, and arranged such that the heat plate is disposed under the load plate, while the heat pipe is arranged above the load plate when a relative movement of the load plate relative to the heat plate occurs from a first position to a second position.

2. The heat dissipating device as claimed in claim 1, the heat plate comprises a planar base as second pressing portion and a protrusion extending from the base as a first pressing portion, the opposite side of the protrusion is a recess.

3. The heat dissipating device as claimed in claim 2, wherein the first pressing portion and the second pressing portion of the heat plate are adapted to synchronously press the electrical package.

4. The heat dissipating device as claimed in claim 2, wherein the load plate comprises a pair of retaining portion and a pair of loading portion connected with the retaining portion for pressing the second pressing portion of the heat plate.

5. The heat dissipating device as claimed in claim 2, wherein the heat pipe is soldered on the first pressing portion of the heat plate.

6. The heat dissipating device as claimed in claim 1, wherein the longitudinal sides and traversal sides of the opening of the load plate is bigger than the respectively longitudinal sides and traversal sides of the heat plate.

7. The heat dissipating device as claimed in claim 6, wherein the longitudinal sides of the heat plate is bigger than the traversal side of the load plate.

8. The heat dissipating device as claimed in claim 1, wherein the load plate is rotated substantially 90 degrees.

9. The heat dissipating device as claimed in claim 1, wherein said relative movement is rotation.

10. An electrical connector assembly comprising:
a socket;
a load plate disposed upon the socket adapt to exert a force toward the socket and having a substantially rectangular configuration defining a central opening having a first length and a first width; and wherein
a heat plate with a heat pipe attached thereon formed an entity heat sink, and assembled the heat sink to the load plate such that the load plate is clamped in between the heat plate and heat pipe due to a rotational movement of the load plate relative to the heat plate from a first position to a second position.

11. The electrical connector assembly as claimed in claim 10, wherein the heat plate is a rectangular configuration and comprises a planar base in the traversal ends and a recess formed on a bottom surface of the base and the opposite side of the recess is protrude from the planar base formed a protrusion.

12. The electrical connector assembly as claimed in claim 11, wherein heat pipe is soldered on the protrusion of the heat plate.

13. The electrical connector assembly as claimed in claim 10, wherein the longitudinal sides and traversal sides of the opening of the load plate is bigger than the respectively longitudinal sides and traversal sides of the heat plate.

14. The electrical connector assembly as claimed in claim 13, wherein the heat sink and the load plate are assembled by passing the heat plate through the opening of the load plate and then rotated the load plate substantially 90 degrees.

15. An electrical assembly comprising:
an electronic package generating heat and defining an upper plane with a die raised in a middle portion thereof;
a heat plate having a step structure with upper and lower pieces respectively downwardly confronting the upper plane and the die;
a heat pipe preassembled with the upper piece; and
a load plate defining first and second positions relative to the heat plate under a condition that said load plate allows the associated preassembled heat pipe and heat plate approaches downwardly toward the load plate and the electronic package when said load plate is located in said first position, and downwardly presses the heat plate to have said heat plate downwardly press the electronic package synchronically when said load plate is moved from the first position to the second position in between the heat plate and heat pipe.

16. The electrical assembly as claimed in claim 15, wherein said electronic package is seated upon an electrical connector which is seated upon a printed circuit board to which the load plate is secured.

17. The electrical assembly as claimed in claim 15, wherein the heat pipe is longer than the load plate.

18. The electrical assembly as claimed in claim 15, wherein movement between said first position and said second position is essentially rotation.

19. The electrical assembly as claimed in claim 15, wherein said load plate and the associated preassembled heat pipe and heat plate, are combined together as one piece when said load plate is located in the second position.

* * * * *